(12) United States Patent
Novak

(10) Patent No.: US 6,798,640 B1
(45) Date of Patent: Sep. 28, 2004

(54) CAPACITOR HAVING PLATES WITH A PATTERN VOID OF CONDUCTIVE MATERIAL AND METHOD OF MAKING THERFOR

(75) Inventor: Istvan Novak, Maynard, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/653,832

(22) Filed: Sep. 3, 2003

(51) Int. Cl.$^7$ ............................................... H01G 4/005
(52) U.S. Cl. .................... 361/303; 361/306.3; 29/25.41
(58) Field of Search ............................. 361/303, 306.1, 361/306.3, 321.2, 309–310, 313; 29/25.41, 25.42

(56) References Cited

U.S. PATENT DOCUMENTS 3,679,950 A * 7/1972 Rutt ........................ 361/321.4
3,829,356 A * 8/1974 Rutt ............................ 428/77

* cited by examiner

Primary Examiner—Anthony Dinkins
(74) Attorney, Agent, or Firm—Meyertons Hood Kivlin Kowert & Goetzel, P.C.; B. Noël Kivlin; Erik A. Heter

(57) ABSTRACT

A method for constructing a capacitor having an increased equivalent series resistance (ESR) is disclosed. In one embodiment, a capacitor includes a plurality of capacitor plates comprised of a conductive material and first and second capacitor terminals. At least one of the capacitor plates is coupled to the first terminal and at least one of the capacitor plates is coupled to the second terminal. At least one of the plurality of capacitor plates includes a pattern, wherein the pattern is void of conductive material. The void in the conductive material formed by the pattern may cause a path of current flow through the capacitor plate to be substantially altered in comparison to a capacitor plate that is continuous. By using capacitor plates having voids of conductive material that cause the current path to be altered in comparison to continuous capacitor plates, a capacitor can be constructed having a higher ESR.

30 Claims, 4 Drawing Sheets

CAPACITOR HAVING PLATES WITH A PATTERN VOID OF CONDUCTIVE MATERIAL AND METHOD OF MAKING THERFOR

BACKGROUND OF THE INVENTION

1. Field of the Invention

This invention relates to capacitors, and more particularly, methods of controlling electrical quantities associated with them.

2. Description of the Related Art

Capacitors are often used for decoupling and bypassing of noise for power distribution systems, and have a multitude of other uses in electronic circuits. Selection of capacitors for a particular application is based in large part on their various electrical quantities. FIG. 1 shows a simple schematic of a capacitor equivalent circuit for one embodiment of a capacitor. For a given capacitor, the electrical quantities (i.e. characteristics) include a capacitance C, an equivalent series inductance ESL, and an equivalent series resistance ESR. The ESL and ESR components represent parasitic electrical quantities. All three of these electrical quantities may be frequency dependent. For example, ESR occurs at a frequency (i.e. the resonant frequency) where the capacitive and inductive reactances of the capacitor cancel each other out. The inductive reactance of the capacitor may increase for frequencies above the resonant frequency. Broadly speaking for a given capacitor, at frequencies below the resonant frequency, the impedance is generally capacitive, while above the resonant frequency the impedance is generally inductive. At resonant frequency, the impedance of a capacitor is resistive. FIG. 2 illustrates an impedance profile for one embodiment of a typical capacitor.

One type of capacitor that is commonly used in electronic systems is a multi-layer ceramic capacitor (MLCC). FIG. 3 is a side view of one embodiment of a multi-layer ceramic capacitor. In part because of the number of capacitor plates, a multi-layer ceramic capacitor may exhibit a relatively large capacitance in a small package. The small body size may help to limit the amount of inductance. The resistive losses in the conductors depend on various factors such as the number and size of metal plates, the thickness and conductivity of the metal plates, and the resistance of the capacitor terminals.

For some applications, a low value of ESR is desirable. However, other applications exist where a moderate or even high ESR is desirable. In general, the optimum value for a capacitor's ESR is dependent upon the application in which it is implemented. Various methods exist for increasing the ESR for a given capacitor. One method for increasing ESR is to place a resistance (e.g., from a discrete resistor) in series with the capacitor. While this method may increase the ESR, it may also add inductance from the discrete resistor. Alternatively, Tantalum and niobium capacitors, which may have higher ESR values for the same capacitance, may be used instead of multi-layer ceramic capacitors. However, tantalum and niobium capacitors may also be significantly larger than multi-layer ceramic capacitors and may also have a greater inductance. Thus, these solutions may not satisfy the requirements of a higher ESR value without adversely affecting the inductance.

SUMMARY OF THE INVENTION

A method for constructing a capacitor having an increased equivalent series resistance (ESR) is disclosed. In one embodiment, a capacitor includes a plurality of capacitor plates (at least one pair of plates, with each plate of the pair coupled to a different terminal) comprised of a conductive material and first and second capacitor terminals. At least one of the capacitor plates is coupled to the first terminal and at least one of the capacitor plates is coupled to the second terminal. At least one of the plurality of capacitor plates includes a pattern, wherein the pattern is void of conductive material. The void in the conductive material formed by the pattern may cause a path of current flow through the capacitor plate to be substantially altered in comparison to a capacitor plate that is continuous. By using capacitor plates having voids of conductive material that cause the current path to be altered in comparison to continuous capacitor plates, a capacitor can be constructed having a higher ESR.

In one embodiment, a plurality capacitor plates is coupled to the first capacitor terminal and a plurality of capacitor plates is coupled to the second capacitor terminal. An entire edge of each capacitor plate may be connected to its respective terminal. Alternatively, an edge connection including only a portion of the edge (wherein portion is not co-dimensional with the edge) may be used to connect a capacitor plate to its respective terminal.

One or more of the capacitor plates may include the patterns that are void of conductive material. The capacitor may be divided into zones, with the patterns confined to one of the zones. This may ensure that the equivalent series inductance (ESL) of the capacitor is substantially the same as a comparable capacitor wherein none of the plates include patterns that are void of conductive material. Similarly, the patterns void of conductive material may be sized and shaped such that the capacitance value of a capacitor with these plates is substantially the same as a comparable capacitor wherein the capacitor plates are continuous.

In some embodiments, a pattern that is void of conductive material may be created by the manner in which one or more of the capacitor plates are connected to their respective terminals. In such embodiments, only a portion of the edge of a capacitor plate is electrically coupled to its respective terminal. Thus, a void of conductive material exists between the capacitor plate and the respective terminal, and all current flow between the capacitor plate and the terminal is forced to pass through the reduce-size area where the electrical connection is made.

BRIEF DESCRIPTION OF THE DRAWINGS

Other aspects of the invention will become apparent upon reading the following detailed description and upon reference to the accompanying drawings in which.

Figure 1:
FIG. 1 (Prior Art) is a schematic diagram of an equivalent circuit for one embodiment of a capacitor.
Figure 2:
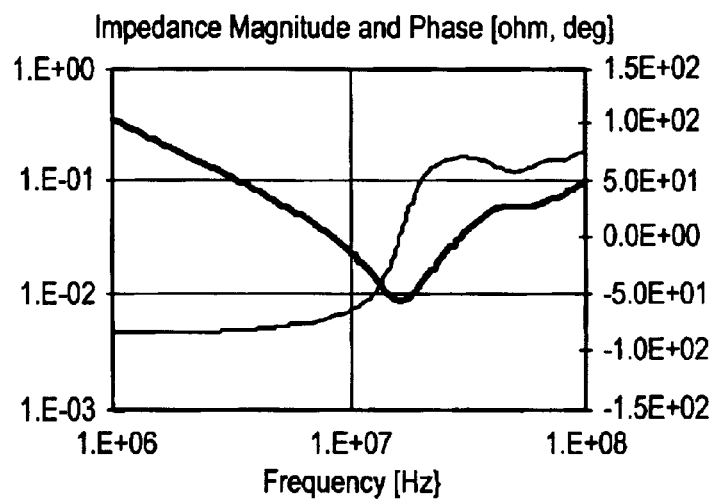
FIG. 2 (Prior Art) is a graph illustrating an impedance profile for one embodiment of a capacitor.
Figure 3:
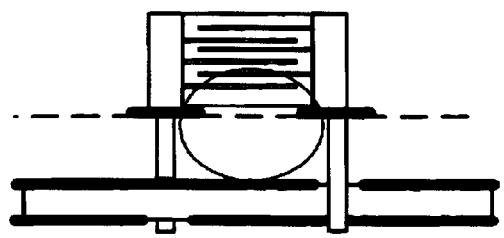
FIG. 3 (Prior Art) is a side view of one embodiment of a multi-layer ceramic capacitor (MLCC)

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Figure 4A:
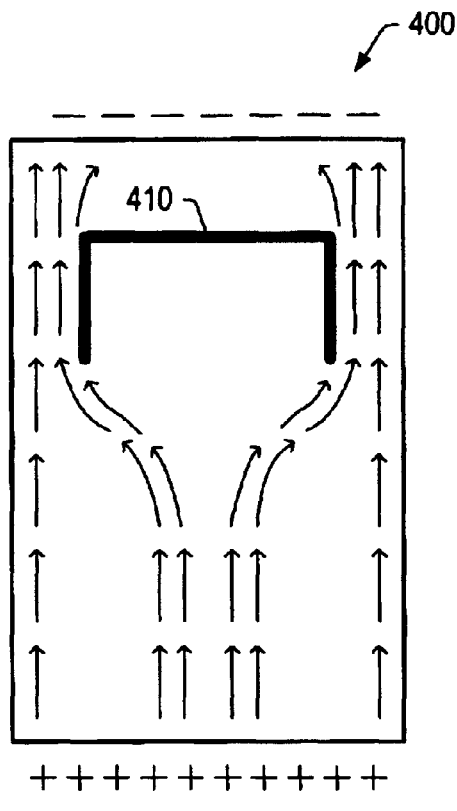
FIG. 4A is a drawing of one embodiment of a conductive sheet with a pattern defining a portion of the sheet void of conductive material, the drawing illustrating the altered current flow due to the pattern.

Turning now to FIG. 4A, a drawing of one embodiment of a conductive sheet having a pattern defining a void of conductive material in the sheet is shown. The drawing illustrates how the current path is altered (in comparison with a continuous sheet) by the presence of the void defined by the pattern. In the embodiment shown, conductive sheet 400 is a sheet of conductive material. Current flows through conductive sheet 400 from a positively charged end of the sheet to a negatively charged end. It is assumed for the purposes of this drawing that the ends of the sheet (marks '+' for the positive end and '−' for the negative end) are coupled in their entirety to electrically conductive terminals.

In the embodiment shown, conductive sheet 400 includes a pattern 410. Pattern 410 represents an area where conductive material has been removed from the sheet. The pattern shown here is for exemplary purposes only, and can have a wide variety of shapes and sizes. Furthermore, the area of removed material is relatively small such that a capacitance of a capacitor formed using the conductive sheet is not substantially affected by virtue of the removed material.

As noted above, current flow through conductive sheet 400 moves from the positively charged end of the sheet to the negatively charged end. Due to the presence of pattern 410, current flow is substantially altered. More particularly, some of the current flowing from the positively charged end of the sheet to the negatively charged end is forced from the middle of the sheet towards the sides in order to get around the pattern. Thus, some of the current is required to travel a greater distance than it otherwise would if the pattern was not present. Since resistance is the product of the sheet resistivity of a material and the distance through the material which the current must travel, the electrical resistance of conductive sheet 400 is increase by the presence of pattern 410. In addition to the greater distance some of the current must travel, the crowding of current near the edges of conductive sheet 400 due to pattern 410 further increases the resistance.

For the purposes of this disclosure, it should be noted that the term "pattern" refers to an area where a void of conductive material exists in a conductive sheet or conductive plate (e.g., a capacitor plate). Similarly, it should be noted that the term patterning refers to the act of creating these voids in the conductive sheets or plates. In one embodiment, the voids may be created by removing material from a conductive sheet or plate. In another embodiment, the voids may be created by forming a conductive sheet or plate having with a void already present. In still another embodiment, voids may be created by connecting the conductive sheet or plate to a capacitor terminal in such a manner that only a portion of the edge of the plate/sheet is connected to the terminal, thereby leaving one or more voids existing between the terminal and the edge.

Figure 4B:
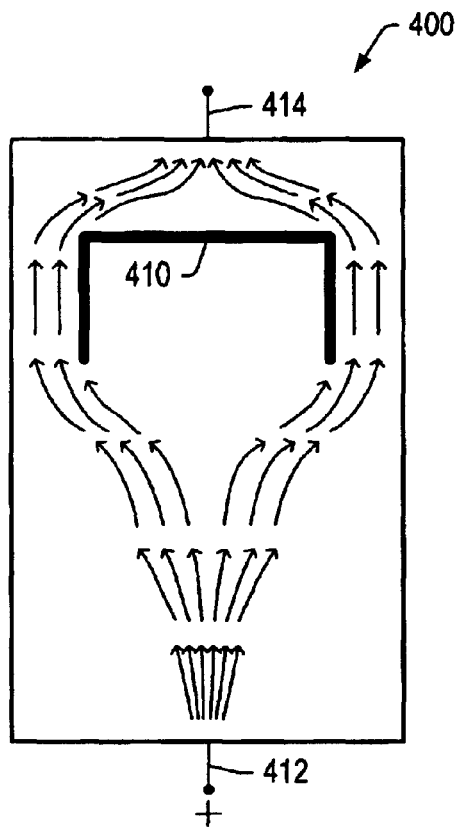
FIG. 4B is a drawing of another embodiment of a conductive sheet with a pattern defining a portion of the sheet void of conductive material, the drawing illustrating the altered current flow due to the pattern.

FIG. 4B is a drawing of another embodiment of a conductive sheet with a pattern defining a void of conductive material in the sheet. In this particular embodiment, conductive sheet 400 includes a positively charged edge connection 412 and a negatively charged edge connection 414. Thus, edge connections 412 and 414 are not co-dimensional with the edge of conductive sheet 410, although they may be wider than the terminals shown here. However, since all current through conductive sheet 400 must pass through the edge connections 412 and 414, current crowding occurs in the vicinity of these connections. In addition to the current crowding that occurs near the edges due to pattern 410 and the re-direction of current flow due to pattern 410, the current crowding through the edge connection may provide additional resistance to current flowing through conductive sheet 400. Using the techniques described in reference to FIGS. 4A and 4B, capacitors may be constructed that have a higher equivalent series resistance (ESR) than they otherwise would if these techniques were not used. It should also be noted that these techniques may be used separately from each other, and that embodiments wherein an edge connection is the primary method (or in some cases, the only method) of increasing ESR are possible and contemplated. One such embodiment is discussed below in reference to FIG. 6A.

As noted above, patterns on conductive sheets (or planes) may have a wide variety of shapes and sizes. For example, given the same size of conductive sheet, a pattern similar to that of pattern 410 in FIG. 4A or 4B may provide a greater resistance if it covers a greater amount of the width of conductive sheet 400 (e.g., by causing additional current crowding) than a similar pattern that covers a smaller amount of the width. In another embodiment, a series of small patterns may be present on a conductive sheet to add more resistance. Patterns may also be staggered with respect to each other, which may increase the distance current must travel through the conductive sheet. Capacitor plates may also include patterns depending on their location in the capacitor, with some plates including the patterns while others do not include any patterns, as will be illustrated now in reference to FIG. 4C.

There are a variety of methods in which a conductive sheet (or conductive plate for a capacitor) having a void may be formed. For example, in one embodiment, conductive material may be removed from a sheet or plate of conductive material by various means, such as chemical etching or by laser. In another embodiment, a conductive sheet or plate may be formed with the void already present. For example, the conductive material may be deposited on a substrate that comprises dielectric material that is to be used in the capacitor. In general, any suitable method may be used for creating a conductive sheet or plate having patterns defining voids of conductive material. These patterns may be formed simultaneously with the conductive sheet or subsequent to the formation of the conductive sheet.

It should also be noted that in some embodiments, the void defined by the pattern may not extend through the entire thickness of the conductive sheet. In other embodiments, the void does extend through the entire thickness of the conductive sheet.

Figure 4C:
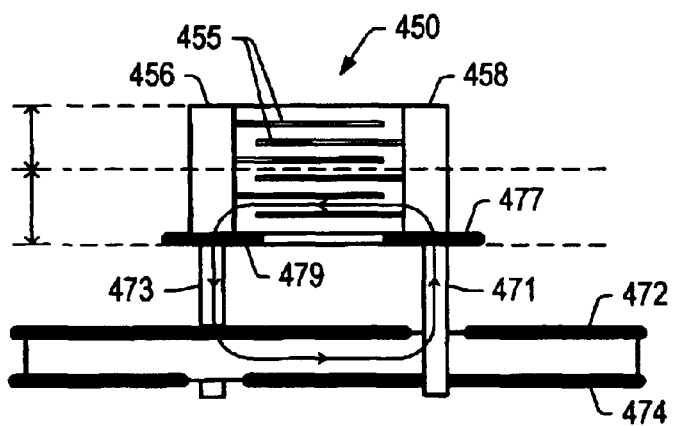
FIG. 4C is a drawing of one embodiment of a capacitor mounted to a printed circuit board illustrating a high-frequency current path.

FIG. 4C is a drawing of one embodiment of a capacitor mounted to a printed circuit board illustrating a high-frequency current path. In the embodiment shown, capacitor 450 is a multi-layer ceramic capacitor, although other embodiments are possible and contemplated. Capacitor 450 is mounted on printed circuit board (PCB) 470. In particular, capacitor 450 is mounted to PCB 470 by coupling capacitor terminals 456 and 458 to pads 477 and 479, respectively. Pads 477 and 479 are coupled to vias 471 and 473, respectively, which in turn are coupled to conductive planes 472 and 474 (also respectively). A plurality of capacitor plates 455 are coupled to each of capacitor terminals 456 and 458.

A high frequency current loop exists through the lower portion of capacitor 450 as well as through vias 471 and 473 and conductive planes 472 and 474. As used herein, the term "high frequency" refers to those frequencies that are greater than the resonant frequency of the capacitor. All capacitors have a resonant frequency. At frequencies below the resonant frequency, the capacitive reactance is the dominant component of the capacitor's impedance profile, and decreases as frequency increases. At the capacitor's resonant frequency, the capacitive and inductive reactances cancel each other out, and thus the resistive component (i.e. equivalent series resistance, or ESR) is the dominant component of the capacitor's impedance profile. For frequencies above the resonant frequency, the inductive reactance is the dominant component of a capacitor's impedance profile, and increases as frequency increases. At frequencies at or below the resonant frequency, current through capacitor 450 will tend to distribute itself along throughout terminals 456 and 458 and along each of capacitor plates 455. However, at frequencies above the capacitor's resonant frequency (where inductive reactance is the dominant impedance component) current tends to be more confined to the lower regions of the capacitor.

Because the current tends to be confined to the lower regions of the capacitor at higher frequencies, it is desirable that the equivalent series inductance (ESL) of the capacitor not be increased by any attempts to increase the capacitor's ESR. Thus, the capacitor may be divided into a keep-out zone and a second zone where patterning is permissible. Since current may be required to travel a greater distance through a capacitor plate having a pattern of removed material, the corresponding inductance encountered by the current may also increase. However, at frequencies that are at resonant frequency or less, the inductive reactance is a negligible component of the capacitor's impedance. Thus, by limiting the patterning to the upper zone shown in the drawing ('Patterning Ok') and avoiding patterning in the keep-out zone, the ESR of the capacitor may be increased without any substantial affect on its ESL.

Figure 5:
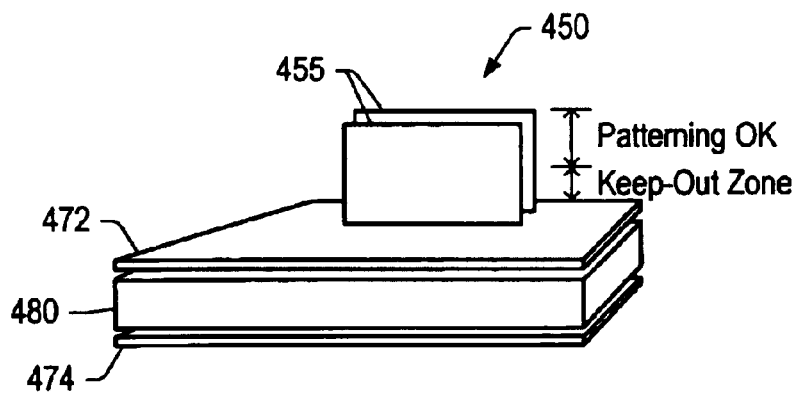
FIG. 5 is a drawing of one embodiment of a capacitor mounted to a printed circuit board wherein the capacitor plates are vertical with respect to the printed circuit board.

FIG. 5 is a drawing of one embodiment of a capacitor mounted to a printed circuit board wherein the capacitor plates are vertical with respect to the printed circuit board. In the embodiment shown, capacitor 450 includes a plurality of vertically oriented (i.e. perpendicular to the printed circuit board upon which the capacitor is mounted) capacitor plates 455 and is electrically coupled to conductive planes 472 and 474. For the purposes of clarity, only the capacitor plates of capacitor 450 is shown. Similarly, only the conductive planes (and dielectric material 480 arranged between them) of the printed circuit board are shown. Although only two capacitor plates 455 are shown in this embodiment, embodiments having a greater number of capacitor plates are possible and contemplated. The capacitor may also include terminals which electrically couples each of the capacitor plates to the conductive planes 472 and 474 (with one of the shown plates coupled to 472, the other to 474). The terminals may contact a capacitor plate along the entirety of a capacitor plate edge, or may only contact a portion of the edge. It should be noted that capacitor embodiments with multiple (i.e. more than two) terminals are possible and contemplated.

As with the example discussed in reference to FIG. 4C, patterns defining voids of conductive material in one or both of the capacitor plates 455 shown in the area above the keep-out zone. This may allow the ESR of the capacitor to be increased (with respect to a like capacitor wherein the capacitor plates have no voids) without increasing the ESL. In general, it is desirable to keep the entry and exit points for currents passing through the capacitor as close to the to the PCB as possible to shorten the distance of the high-frequency current loop.

In one embodiment the terminals that electrically couple capacitor plates 455 to conductive planes 472 and 474 may be located near the bottom of the capacitor. In another embodiment, capacitor 450 may simply be an ordinary two-terminal capacitor that is mounted on its side, although care must be taken to ensure that any patterns defining voids of conductive material that are present are located in the upper portion (i.e. away from the part mounted to the board) of the capacitor.

Figure 6A:
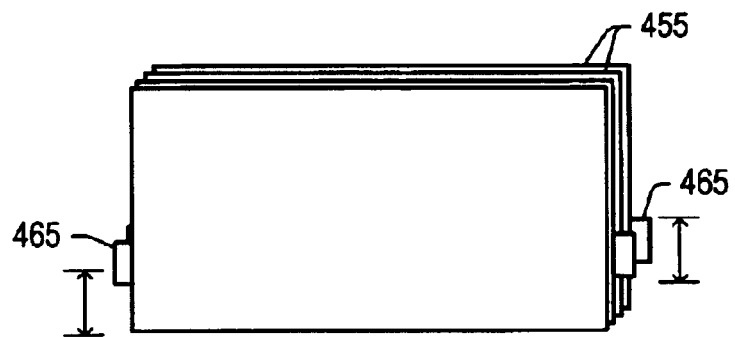
FIG. 6A is a drawing of one embodiment of vertically oriented capacitor plates with entry/exit connections.

Turning now to FIG. 6A, a drawing of one embodiment of vertically oriented capacitor plates with entry/exit connections is shown. In the embodiment shown capacitor plates 455 may be part of a capacitor having plates that are perpendicular to a PCB upon which it is to be mounted. Each capacitor plate 455 includes an edge connection 465. Edge connections 465 are used to electrically connect each of the capacitor plates 455 to their respective terminals (not explicitly shown here). In this particular embodiment, each edge connection 465 contacts only a portion of its respective capacitor plate 455. Thus, current flowing into or out of each capacitor plate may encounter current crowding as it passes through the interface between the capacitor plate 455 and the edge connections 465. This current crowding may also allow for a greater ESR value over embodiments wherein the entire edge of a capacitor plate is coupled to a terminal. By electrically coupling only a portion of the edge of the capacitor plate instead of the entire edge, an area void of conductive material between the capacitor plate and the terminal exists, and thus current is forced to flow into or out of the plate through a restricted area. This redirection of current flow may result in the capacitor having a higher ESR in comparison with a similar capacitor in which the entire edge of one or more capacitor plates are electrically coupled to a respective terminal.

Inductance (ESL) in the embodiment shown in FIG. 6A may be controlled by the positioning of the edge connections 465. For the lowest possible amount of ESL, edge connections 465 are positioned as close as possible to the high-frequency current path, thereby minimizing the distance traveled by high frequency currents. Positioning one or more of the edge connections 465 away from the high frequency current path may increase the ESL. Thus, the positioning of edge connections such as those shown in the embodiment of FIG. 6A may allow for the manipulation of a capacitor's ESL.

Figure 6B:
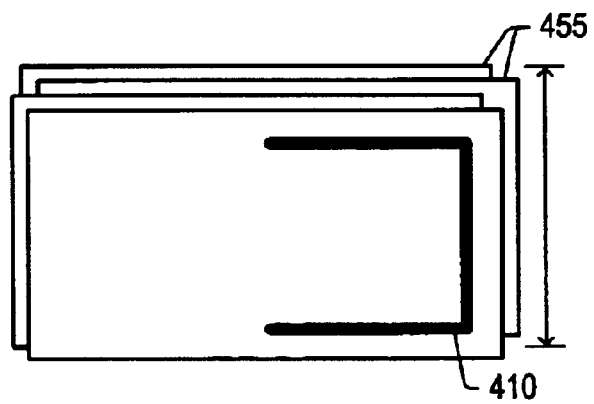
FIG. 6B is a drawing of one embodiment of vertically oriented capacitor plates, wherein the plates are staggered in position such that a full edge of each plate connects to a capacitor terminal.

FIG. 6B is a drawing of one embodiment of vertically oriented capacitor plates, wherein the plates are staggered in position such that a full edge of each plate connects to a capacitor terminal. In the embodiment shown, capacitor plates 455 are staggered in such a manner that allows the full edge of each plate to be connected to a respective terminal (not shown). Thus, in contrast to the embodiment discussed in reference to FIG. 6A, current from an associated terminal can enter or exit a capacitor plate 455 at any point along its edge.

One or more of the capacitor plates 455 may include a pattern 410. Pattern 410 represents a portion of the capacitor plate 455 in which conductive material has been removed. Thus, a gap exists across the width of the pattern, and current flowing through the capacitor plate 455 is restricted by the pattern's shape and size. In this particular embodiment, current entering (or exiting) the capacitor plate 455 having the shown pattern must travel along the edges for a significant portion of the plate's length, thereby forcing some of the current to travel a greater distance through the plate than it would in an unpatterned plate, and also results in current crowding along the edges in proximity of the pattern. In addition, shape of the pattern and its proximity to the capacitor plate edge may result in additional current crowding.

Although pattern 410 in the embodiment shown here has a significant width relative to the size of the capacitor plates, it should be noted that the width of any such pattern may be much smaller relative to the capacitor plate dimensions. As such, one or more voids of conductive material may be present in accordance with the size and shape of the patterns such that the effect on the capacitor's capacitance value is negligible. In other words, the width of a pattern defining a void of conductive material (for one example, other dimensions may be affected as well) may be very small. Patterns may therefore be implemented such that ESR is significantly impacted by the void of conductive material in accordance with their shape, while having no substantial effect on the capacitor's ESL or capacitance.

Although only a single pattern is shown here, it should be noted that embodiments are possible and contemplated wherein multiple patterns defining voids of conductive material may be implemented. There is no theoretical limit to the number of patterns that may be implemented on a given capacitor plate. Furthermore, patterns may be implemented in virtually any shape, and thus are not limited to the specific shape shown here. The exact number of patterns, as well as their size, shape, and location may be determined by the desired ESR for a particular implementation.

Figure 7:
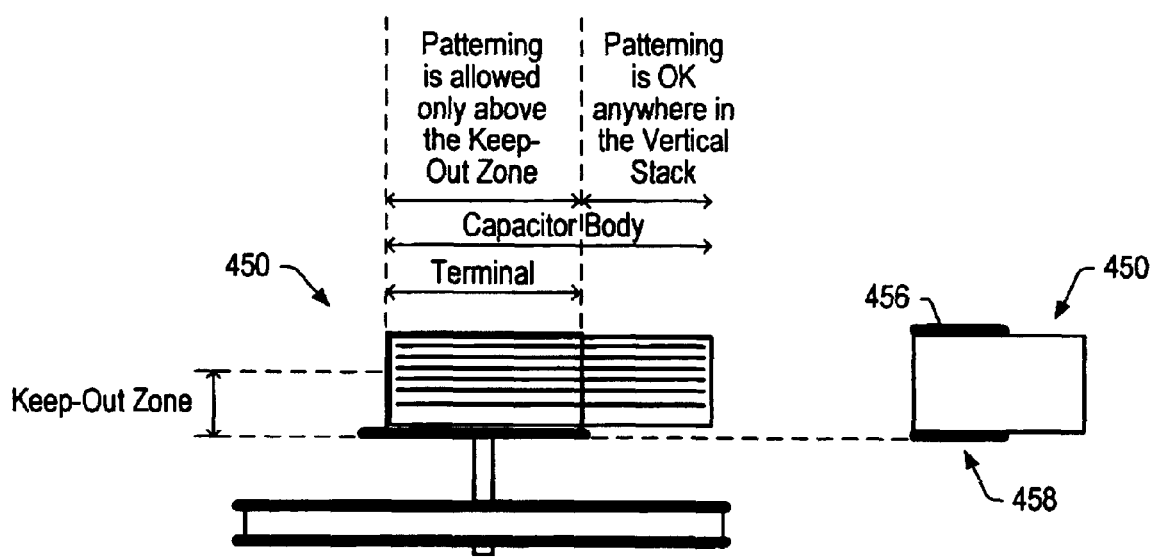
FIG. 7 is a view of one embodiment of a multi-layer ceramic capacitor having horizontally oriented capacitor plates.

FIG. 7 is a view of one embodiment of a multi-layer ceramic capacitor having horizontally oriented capacitor plates. FIG. 7 shows both a top view and a side view of another embodiment of capacitor 450. In this particular embodiment, the body of capacitor 450 is wider than the capacitor terminals 456 and 458, which are oriented towards a particular side.

In order to increase the capacitor's ESR without substantially affecting its capacitance or ESL, patterning may be performed in the zone outside of that defined by the terminal. The particular implementation of capacitor 450 shown here is a multi-layer ceramic capacitor having a stack of capacitor plates. In the portion of the capacitor body extending beyond the capacitor terminal, patterning may be performed anywhere within the vertical stack of capacitor plates. In the portion of the capacitor body that does not extend beyond the width defined by the terminal, a keep-out zone exists. Patterning may be performed in the area of the vertical stack that is above the keep-out zone. However, in order to prevent or minimize any effects of patterning on the capacitor's ESL, patterning is typically not performed in the keep-out zone. This is because the keep-out zone is part of the high-frequency current loop, and thus patterning in this area can affect the impedance profile above the resonant frequency, which is dominated by inductive reactance.

While the embodiments shown here have been applied to various types of surface mounted capacitors, other embodiments of capacitors having patterned capacitor plates are possible and contemplated. In general, patterning may be performed for any capacitor where the desired ESR is greater than that which would be present for an unpatterned version of the same or similar capacitor.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A method for constructing a capacitor, the method comprising:
    providing a plurality of capacitor plates comprised of a conductive material, wherein at least one of the plurality of capacitor plates includes a pattern that is void of conductive material; and
    coupling the plurality of capacitor plates to capacitor terminals including a first terminal and a second terminal, wherein at least one of the plurality of capacitor plates is coupled to a first terminal and at least one of the plurality of capacitor plates is coupled to a second terminal.

2. The method as recited in claim 1, wherein the pattern that is void of conductive material is internal with respect to the edges of the capacitor plate.

3. The method as recited in claim 1 further comprising arranging the each of the plurality of capacitor plates such that the capacitor plates are perpendicular with respect to a printed circuit board (PCB) when the capacitor mounted on the PCB.

4. The method as recited in claim 1 further comprising dividing the capacitor into a first zone and a second zone, wherein the pattern is located in the second zone and wherein the first zone includes one of the first or second terminals.

5. The method as recited in claim 4, wherein the capacitor plates are horizontal with respect to a PCB when the capacitor is mounted on the PCB.

6. The method as recited in claim 1, wherein the capacitance of the capacitor is substantially the same in comparison with a similar capacitor wherein no capacitor plates of the similar capacitor include an internal pattern void of conductive material.

7. The method as recited in claim 1, wherein the equivalent series inductance of the capacitor is substantially the same in comparison with a similar capacitor wherein none of the capacitor plates of the similar capacitor include an internal pattern void of conductive material.

8. The method as recited in claim 1, wherein a path of current flow through the at least one of the plurality of capacitor plates having a pattern that is void of conductive material is substantially altered in comparison to a path of current flow through a continuous capacitor plate.

9. The method as recited in claim 1 wherein the internal void extends across a portion of the mid section of the capacitor plate.

10. The method as recited in claim 1, wherein two or more of the plurality of capacitor plates includes at least one internal pattern void of conductive material.

11. The method as recited in claim 1, wherein the capacitor is a multi-layer ceramic capacitor.

12. The method as recited in claim 1 further comprising coupling an edge of one of the plurality of capacitor plates to one of the capacitor terminals, wherein the one of the capacitor terminals is one of the first or second terminals.

13. The method as recited in claim 1 further comprising coupling one of the plurality of capacitor plates to one of the capacitor terminals through an edge connection, wherein the edge connection is not co-dimensional with an edge of the one of the plurality of capacitor plates.

14. The method as recited in claim 1, wherein the one of the plurality of capacitor plates having the pattern that is void of conductive material is formed with the pattern.

15. The method as recited in claim 1, wherein the pattern that is void of conductive material in the one of the capacitor plates is formed by removing conductive material subsequent to forming the capacitor plate.

16. A capacitor comprising:
capacitor terminals including a first terminal and a second terminal; and
a plurality of capacitor plates, wherein at least one of the capacitor plates is coupled to the first terminal and one of the capacitor plates is coupled to the second terminal, wherein each of the plurality of capacitor plates is comprised of a conductive material and wherein at least one of the plurality of capacitor plates includes a pattern that is void of conductive material.

17. The capacitor as recited in claim 16, wherein the pattern that is void of conductive material is internal with respect to the edges of the capacitor plate.

18. The capacitor as recited in claim 16, wherein each of the plurality of capacitor plates are arranged such that the capacitor plates are perpendicular to a printed circuit board (PCB) when the capacitor is mounted to the PCB.

19. The capacitor as recited in claim 16, wherein the capacitor is divided into a first zone and a second zone, wherein the pattern is located in the second zone and wherein the first zone includes one of the first or second terminals.

20. The capacitor as recited in claim 19, wherein the capacitor plates are horizontal with respect to a PCB when the capacitor is mounted on the PCB.

21. The capacitor as recited in claim 16, wherein the capacitance of the capacitor is substantially the same in comparison with a similar capacitor wherein no capacitor plates of the similar capacitor include an internal pattern void of conductive material.

22. The capacitor as recited in claim 16, wherein the equivalent series inductance of the capacitor is substantially the same in comparison with a similar capacitor wherein no capacitor plates of the similar capacitor include an internal pattern void of conductive material.

23. The capacitor as recited in claim 16, wherein a path of current flow through the at least one of the plurality of capacitor plates having a pattern that is void of conductive material is substantially altered in comparison to a path of current flow through a continuous capacitor plate.

24. The capacitor as recited in claim 16, wherein the internal void extends across a portion of the mid section of the capacitor plate.

25. The capacitor as recited in claim 16, wherein two or more of the plurality of capacitor plates includes at least one internal pattern void of conductive material.

26. The capacitor as recited in claim 16, wherein the capacitor is a multi-layer ceramic capacitor.

27. The capacitor as recited in claim 16, wherein an edge of at least one of the plurality of capacitor plates is coupled to one of the capacitor terminals.

28. The capacitor as recited in claim 16 wherein one of the plurality of capacitor plates is coupled to one of the capacitor terminals through an edge connection, wherein the edge connection is not co-dimensional with an edge of the one of the plurality of capacitor plates.

29. A method for constructing a capacitor, the method comprising:
providing a plurality of capacitor plates comprised of a conductive material; and
electrically coupling the plurality of capacitor plates to capacitor terminals including a first terminal and a second terminal, wherein at least one of the plurality of capacitor plates is coupled to a first terminal and at least one of the plurality of capacitor plates is coupled to a second terminal, and wherein at least one of the plurality of capacitor plates is coupled such that a void of conductive material exists between the capacitor plate and one of the capacitor terminals to which it is electrically coupled.

30. A capacitor comprising:
capacitor terminals including a first terminal and a second terminal; and
a plurality of capacitor plates, wherein at least one of the capacitor plates is coupled to the first terminal and one of the capacitor plates is coupled to the second terminal, wherein each of the plurality of capacitor plates is comprised of a conductive material, and wherein at least one of the plurality of capacitor plates is coupled such that a void of conductive material exists between the capacitor plate and one of the capacitor terminal to which it is electrically coupled.

* * * * *